United States Patent
Melik-Martirosian et al.

(10) Patent No.: US 7,630,253 B2
(45) Date of Patent: Dec. 8, 2009

(54) FLASH MEMORY PROGRAMMING AND VERIFICATION WITH REDUCED LEAKAGE CURRENT

(75) Inventors: Ashot Melik-Martirosian, Sunnyvale, CA (US); Ed Runnion, Santa Clara, CA (US); Mark Randolph, San Jose, CA (US); Meng Ding, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/398,415

(22) Filed: Apr. 5, 2006

(65) Prior Publication Data
US 2007/0237003 A1 Oct. 11, 2007

(51) Int. Cl.
*G11C 16/04* (2006.01)

(52) U.S. Cl. .............................. 365/185.28; 365/185.16; 365/185.18

(58) Field of Classification Search ............. 365/185.28
See application file for complete search history.

(56) References Cited

U.S. PATENT DOCUMENTS

| | | | | |
|---|---|---|---|---|
| 5,487,033 A | * | 1/1996 | Keeney et al. | 365/185.19 |
| 5,553,020 A | * | 9/1996 | Keeney et al. | 365/185.19 |
| 6,339,540 B1 | | 1/2002 | Lavi | |
| 6,469,939 B1 | * | 10/2002 | Wang et al. | 365/185.28 |
| 6,525,969 B1 | | 2/2003 | Kurihara et al. | |
| 6,795,342 B1 | * | 9/2004 | He et al. | 365/185.16 |
| 6,862,221 B1 | | 3/2005 | Melik-Martirosian et al. | |
| 6,868,014 B1 | | 3/2005 | Melik-Martirosian et al. | |
| 7,200,045 B2 | * | 4/2007 | Lue et al. | 365/185.28 |
| 2002/0159293 A1 | | 10/2002 | Hamilton et al. | |
| 2003/0021155 A1 | | 1/2003 | Yachareni et al. | |
| 2004/0208057 A1 | | 10/2004 | Hamilton et al. | |
| 2006/0146614 A1 | * | 7/2006 | Lue et al. | 365/185.28 |

OTHER PUBLICATIONS

PCT Search Report for PCT/US07/08606, Sep. 18, 2007, Spansion LLC.
PCT Written Opinion for PCT/US07/08606, Sep. 18, 2007, Spansion LLC.

* cited by examiner

*Primary Examiner*—Son L Mai

(57) ABSTRACT

A flash memory system configured in accordance with an example embodiment of the invention employs a virtual ground array architecture. During programming operations, target memory cells are biased with a positive source bias voltage to reduce or eliminate leakage current that might otherwise conduct through the target memory cells. A positive source bias voltage may also be applied to target memory cells during verification operations (program verify, soft program verify, erase verify) to reduce or eliminate leakage current that might otherwise introduce errors in the verification operations.

12 Claims, 6 Drawing Sheets

FLASH MEMORY PROGRAMMING AND VERIFICATION WITH REDUCED LEAKAGE CURRENT

TECHNICAL FIELD

Embodiments of the present invention relate generally to flash memory devices. More particularly, embodiments of the present invention relate to the programming and verification operations for flash memory devices.

BACKGROUND

Flash memory is a type of electronic memory media that can hold its data in the absence of operating power. Flash memory can be programmed, erased, and reprogrammed during its useful life (which may be up to one million write cycles for typical flash memory devices). Flash memory is becoming increasingly popular as a reliable, compact, and inexpensive nonvolatile memory in a number of consumer, commercial, and other applications. As electronic devices get smaller and smaller, it becomes desirable to increase the amount of data that can be stored per unit area on an integrated circuit memory element, such as a flash memory unit. In this regard, one conventional flash memory technology is based upon a memory cell that utilizes a charge trapping dielectric element that is capable of storing two bits of data. In such an arrangement, one bit can be stored using a first charge storing region on one side of the charge trapping dielectric element, while a second bit can be stored using a second charge storing region on the other side of the charge trapping dielectric element.

FIG. 1 is a cross sectional view of a conventional dual bit memory cell 100. Memory cell 100 includes a silicon nitride layer 102 and a P-type semiconductor substrate 104 having a first buried junction region 106 and a second buried junction region 108. First buried junction region 106 and second buried junction region 108 are each formed from an N+ semiconductor material. Silicon nitride layer 102 is sandwiched between two layers of silicon oxide (identified by reference numbers 110 and 112).

Overlying silicon oxide layer 110 is a polysilicon gate 114. Gate 114 is doped with an N-type impurity (e.g., phosphorus). Memory cell 100 is capable of storing two data bits: a left bit represented by the dashed circle 116; and a right bit represented by the dashed circle 118. In practice, memory cell 100 is generally symmetrical and first buried junction region 106 and second buried junction region 108 are interchangeable. In this regard, first buried junction region 106 may serve as the source region with respect to the right bit 118, while second buried junction region 108 may serve as the drain region with respect to the right bit 118. Conversely, second buried junction region 108 may serve as the source region with respect to the left bit 116, while first buried junction region 106 may serve as the drain region with respect to the left bit 116.

FIG. 2 is a simplified diagram of a plurality of dual bit memory cells arranged in accordance with a conventional virtual ground array architecture 200 (a practical array architecture can include thousands of dual bit memory cells). Array architecture 200 includes a number of buried bitlines formed in a semiconductor substrate as mentioned above. FIG. 2 depicts three buried bit lines (reference numbers 202, 204, and 206), each being capable of functioning as a drain or a source for memory cells in array architecture 200. Array architecture 200 also includes a number of wordlines that are utilized to control the gate voltage of the memory cells. FIG. 2 depicts four wordlines (reference numbers 208, 210, 212, and 214) that generally form an orthogonal pattern with the bitlines. Although not shown in FIG. 2, charge trapping dielectric material is sandwiched in the junctions between the bitlines and the wordlines. The dashed lines in FIG. 2 represent two of the dual bit memory cells in array architecture 200: a first cell 216 and a second cell 218. Notably, bitline 204 is shared by first cell 216 and second cell 218. Array architecture 200 is known as a virtual ground architecture because ground potential can be applied to any selected bitline and there need not be any bitlines with a fixed ground potential.

Control logic and circuitry for array architecture 200 governs the selection of memory cells, the application of voltage to the wordlines, and the application of voltage to the bitlines during conventional flash memory operations, such as: programming; reading; erasing; and soft programming. Voltage is delivered to the bitlines using conductive metal lines and bitline contacts. FIG. 2 depicts three conductive metal lines (reference numbers 220, 222, and 224) and three bitline contacts (reference numbers 226, 228, and 230). For a given bitline, a bitline contact is used once every 16 wordlines because the resistance of the bitlines is very high.

Programming of memory cell 100 can be accomplished by known hot electron injection techniques (also known as channel hot electron or CHE programming). In accordance with conventional programming techniques, the right bit 118 is programmed by applying a relatively high programming voltage to gate 114 via the appropriately selected wordline, grounding the bitline corresponding to first buried junction region 106 (which serves as the source in this case), and applying a relatively high drain bias voltage to the bitline corresponding to second buried junction region 108 (which serves as the drain in this case). Conversely, the left bit 116 is programmed by applying a relatively high programming voltage to gate 114 via the appropriately selected wordline, grounding the bitline corresponding to second buried junction region 108 (which serves as the source in this case), and applying a relatively high drain bias voltage to the bitline corresponding to first buried junction region 106 (which serves as the drain in this case).

Referring again to FIG. 2, conventional CHE programming of a flash memory array arranged in a virtual ground architecture may result in excessive current leakage flowing under the unselected wordlines, between the wordlines, and in the bitline contact areas, and, hence, excessive power consumption. Such bitline leakage current can increase the required programming current by tens of microamperes, which is a significant amount considering the nominal operating characteristics of such a flash memory array. Moreover, due to natural degradation of the cells, the amount of this parasitic leakage current can increase by roughly up to two orders of magnitude (100×) after the array has experienced many program-erase cycles. Excessive leakage current can be very undesirable in low power applications such as portable electronic devices, wireless telephones, or the like. Excessive leakage current may have other negative implications in a practical flash memory device, such as an undesirable reduction of the voltage delivered to the drain of the cell during the programming operation.

Bitline leakage current can also occur during conventional verification operations for a virtual ground architecture—soft program verify, erase verify, and program verify. Such verification operations are similar to the programming operations mentioned above, however, lower wordline voltages and lower drain bias voltages are applied. The goal of such verification operations is to determine whether the threshold voltage ($V_T$) of the target memory cell is within a desired range corresponding to an acceptable erase state or an acceptable program state, depending upon the particular verification operation. Regardless of the particular $V_T$ being verified, the verification operation generates a very low verification current in the target memory cell and compares the verification current to a reference current generated by a reference memory cell. Bitline leakage current, even in small amounts, can introduce errors in the verification operation because the measurement circuitry measures the actual verification current combined with any leakage current.

Accordingly, it is desirable to control, reduce, or eliminate leakage current during programming of memory cells in a virtual ground architecture. In addition, it is desirable to control, reduce, or eliminate the leakage current component during verification operations of memory cells in a virtual ground architecture. Furthermore, other desirable features and characteristics of embodiments of the present invention will become apparent from the subsequent detailed description and the appended claims, taken in conjunction with the accompanying drawings and the foregoing technical field and background.

BRIEF SUMMARY

A flash memory programming technique as described herein can be utilized with memory cells arranged in a virtual ground architecture. The programming technique reduces bitline leakage current during programming, which conserves power. Various flash memory verification techniques as described herein can also be utilized with memory cells arranged in a virtual ground architecture. The verification techniques reduce the bitline leakage current component in the measured current, resulting in more accurate assessment of the actual verification current generated by the target cell.

The above and other aspects of the invention may be carried out in one embodiment by a method of programming a nonvolatile memory device having an array of cells arranged in a virtual ground architecture, each cell including a gate corresponding to a wordline in the array, a selectable source/drain corresponding to a bitline in the array, and a selectable drain/source corresponding to a bitline in the array. The method involves: selecting a target cell in the array for programming; applying a programming voltage to the wordline corresponding to the target cell; applying a drain bias voltage to a first selectable bitline corresponding to the drain of the target cell; and establishing a positive source bias voltage at a second selectable bitline corresponding to the source of the target cell.

The above and other aspects of the invention may also be carried out in one embodiment by a method of verifying operations performed on a nonvolatile memory device having an array of cells arranged in a virtual ground architecture, each cell including a gate corresponding to a wordline in the array, a selectable source/drain corresponding to a bitline in the array, and a selectable drain/source corresponding to a bitline in the array. The method involves: applying a verification voltage to the wordline corresponding to a target cell; applying a drain bias voltage to a first selectable bitline corresponding to the drain of the target cell; controlling bitline leakage current with a positive source bias voltage at a second selectable bitline corresponding to the source of the target cell; and processing a verification current flowing through the target cell.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

Figure 1:
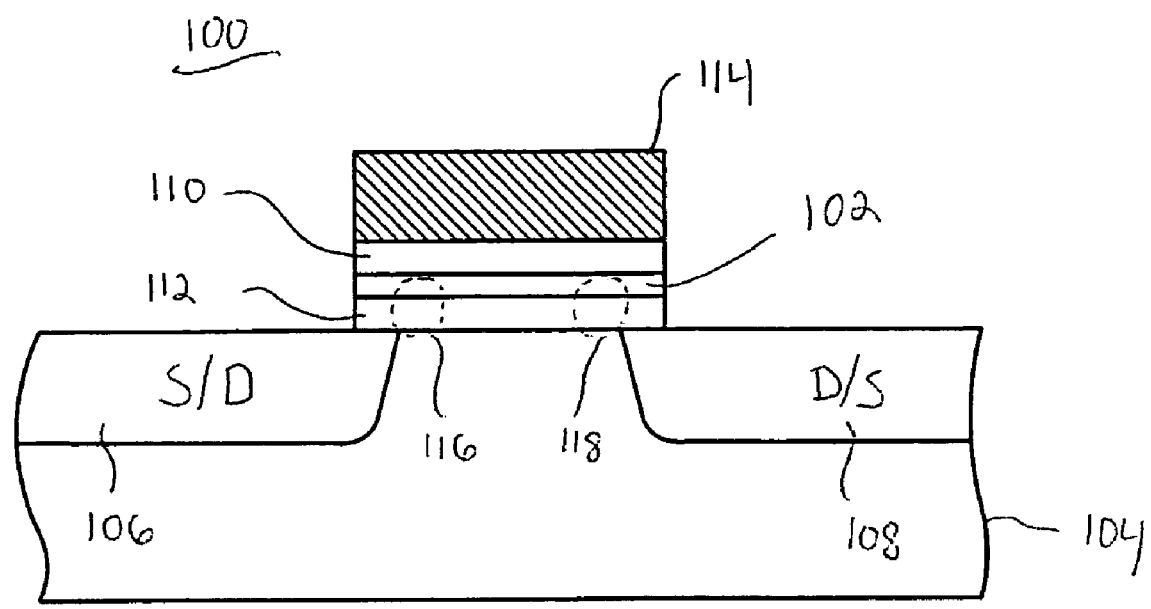
FIG. 1 is a cross sectional view of a conventional dual bit memory cell.

The following detailed description is merely illustrative in nature and is not intended to limit the embodiments of the invention or the application and uses of such embodiments. Furthermore, there is no intention to be bound by any expressed or implied theory presented in the preceding technical field, background, brief summary or the following detailed description.

Embodiments of the invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present invention may be practiced in conjunction with any number of data transmission protocols and that the system described herein is merely one example embodiment of the invention.

For the sake of brevity, conventional techniques related to transistor design and manufacturing, the control of flash memory devices, memory cell programming, memory cell erasing, memory cell soft programming, memory cell verification operations, and other functional aspects of the devices and systems (and the individual operating components of the devices and systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the invention.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the schematic shown in FIG. 3 depicts one example arrangement of elements, additional intervening elements, devices, features, or components may be present in an embodiment of the invention (assuming that the functionality of the system is not adversely affected).

Figure 3:
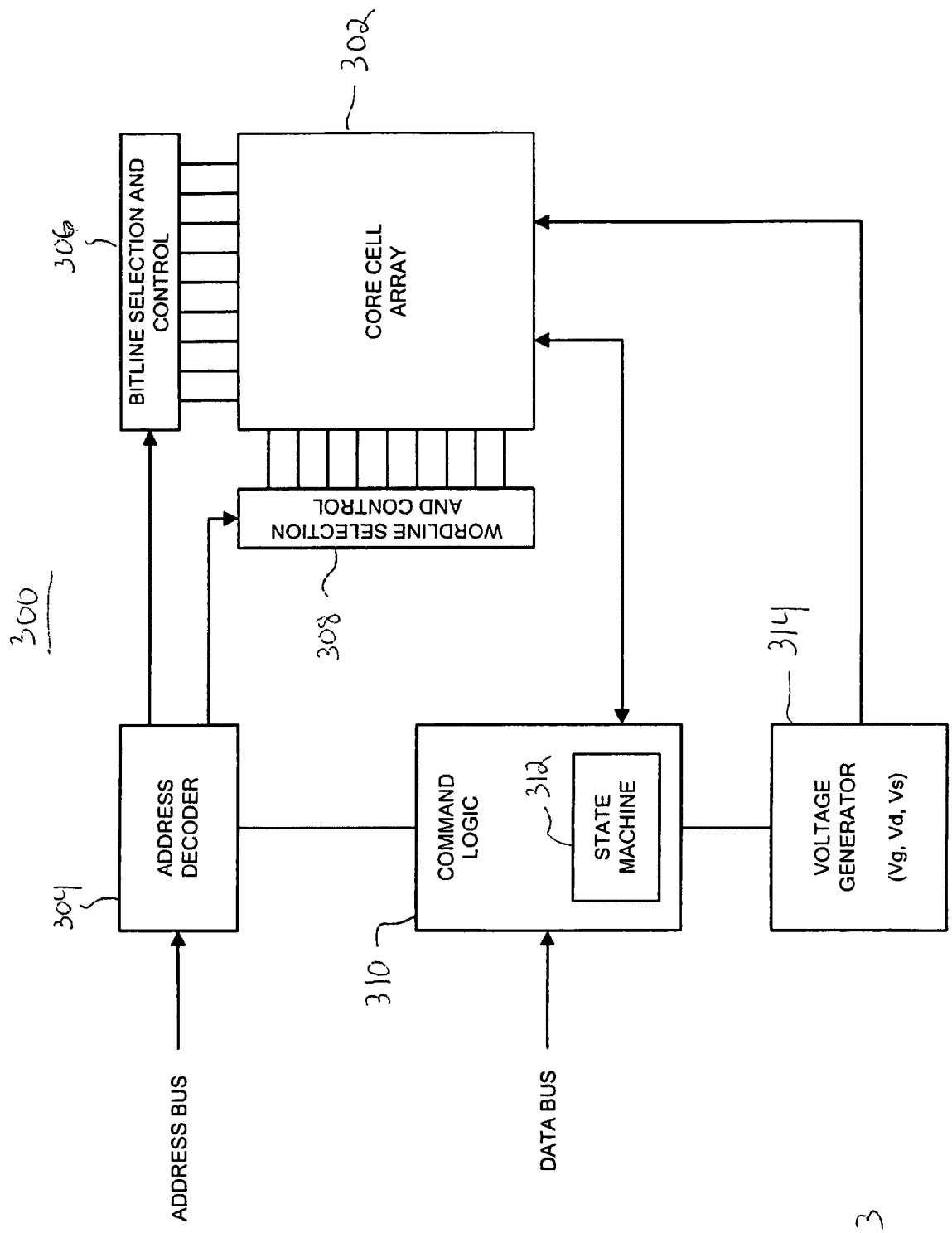
FIG. 3 is a schematic representation of a flash memory system configured in accordance with an example embodiment of the invention.

FIG. 3 is a schematic representation of a flash memory system 300 configured in accordance with an example embodiment of the invention. System 300 is an overly simplified representation of an example embodiment, and an actual deployment of system 300 may include conventional elements, logic, components, and functionality not shown in FIG. 3. Briefly, system 300 is provided for performing programming, verifying, soft programming and erasing of a core cell array 302 that utilizes a virtual ground architecture. In this regard, the memory cells within core cell array 302 may be dual bit memory cells (see FIG. 1), single bit memory cells, or any suitably configured flash memory cells. In practical embodiments, core cell array 302 is partitioned into a plurality of sectors, where memory cells within a sector are grouped together via all the wordlines that share the same sector address. It is to be appreciated that core cell array 302 could be realized in any number of different configurations, for example, 128,000 cells comprised of 16 normal bits and 16 complimentary bits on 16 cells. In addition, core cell array 302 may utilize any number of sectors (within practical limitations).

Flash memory system 300 includes an address decoder 304 coupled to core cell array 302 for decoding input and/or output ("I/O") signals during various operations that are performed on core cell array 302 (e.g., programming, reading, verifying, soft programming, erasing). In this example, address decoder 304 receives address bus information from a system controller (not shown) or the like. Address decoder 304 may be coupled to bitline selection and control logic 306, which is suitably configured to select one or more desired bitlines as needed to support the various flash memory operations described herein. Likewise, address decoder 304 may be coupled to wordline selection and control logic 308, which is suitably configured to select one or more desired wordlines as needed to support the various flash memory operations described herein. System 300 may leverage known addressing and switching techniques to select a desired target cell (or a plurality of target cells) in core cell array 302 for programming, soft programming, reading, erasing, program verification, erase verification, soft program verification, etc.

Flash memory system 300 may also utilize a command logic component 310, which may include or communicate with a state machine 312. In example embodiments of system 300, command logic component 310 and/or state machine 312 may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, a processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration.

In this example, command logic component 310 is coupled to core cell array 302 using suitable interconnection elements, structure, or architecture. Command logic component 310 and state machine 312 may receive commands or instructions from a data bus connected to a system controller or the like. The commands or instructions invoke algorithms embedded in command logic component 310 and state machine 312. The algorithms perform the various tasks and processes related to programming, reading, erasing, soft programming, verifying, and other operations to be described herein. Moreover, the steps of a method or algorithm described in connection with the embodiments disclosed herein may be realized directly in hardware, in firmware, in a software module executed by a processor, or in any practical combination thereof. A software module may reside in RAM memory, flash memory, ROM memory, EPROM memory, EEPROM memory, registers, a hard disk, a removable disk, a CD-ROM, or any other form of storage medium known in the art.

Flash memory system 300 may also include a voltage generator component 314, which is coupled to core cell array 302, to command logic component 310, and to state machine 312. Voltage generator component 314 is controlled by command logic component 310 and/or state machine 312. Voltage generator component 314 is suitably configured to generate the necessary voltages utilized in connection with programming, reading, erasing, soft programming, and verifying of the memory cells in core cell array 302. For example, voltage generator component 314 may include or utilize one or more charge pumps, one or more voltage divider circuits, and/or one or more distinct voltage sources. Voltage generator component 314 may be designed to provide any number of fixed, variable, and/or dynamically adjustable voltage signals. As described in more detail below, voltage generator component 314 is configured to generate and apply the following to core cell array 302, without limitation: programming voltages ($V_G$) applied to the wordlines of target cells; drain bias voltages ($V_D$) applied to selectable bitlines of target cells; source bias voltages ($V_S$) applied to selectable bitlines of target cells; verification voltages applied to the wordlines of target cells; verification voltages applied to the wordline of a reference cell; and bias voltages applied to the reference cell.

Figure 4:
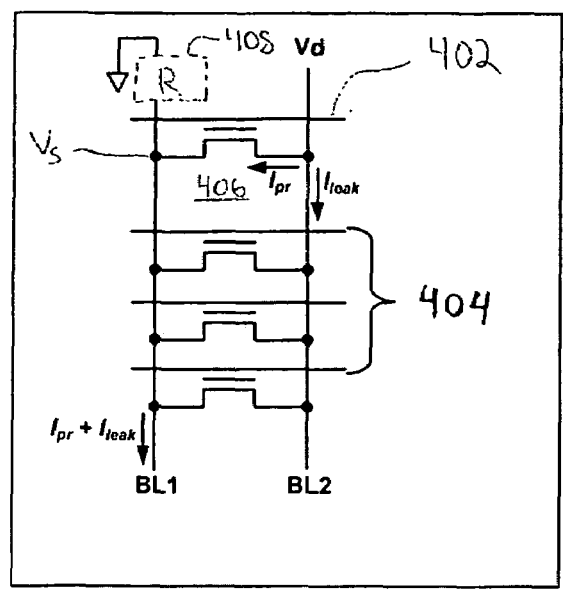
FIG. 4 is a schematic diagram that depicts a programming operation according to an example embodiment of the invention.

FIG. 4 is a schematic diagram that depicts a CHE programming operation according to an example embodiment of the invention. FIG. 4 shows four memory cells within a memory device array arranged in a virtual ground architecture. Although not a requirement of the invention, these memory cells may be dual bit memory cells as described previously; each cell includes a gate corresponding to a wordline in the array, each cell includes a selectable source/drain corresponding to one bitline in the array, and each cell includes a selectable drain/source corresponding to another bitline in the array. In this regard, FIG. 4 shows a first bitline BL1, a second bitline BL2, a selected wordline 402, three unselected wordlines 404, and a target cell 406 in the array. In practice, unselected wordlines 404 are grounded. Target cell 406 represents a cell that has been selected for programming, while the remaining three cells represent cells that have not been selected for programming. Although not shown in FIG. 4, the array will typically include additional bitlines that need not be selected for programming of target cell 406. Unselected bitlines are left floating or are connected to a very high resistance to effectively create an open circuit condition.

Figure 2:
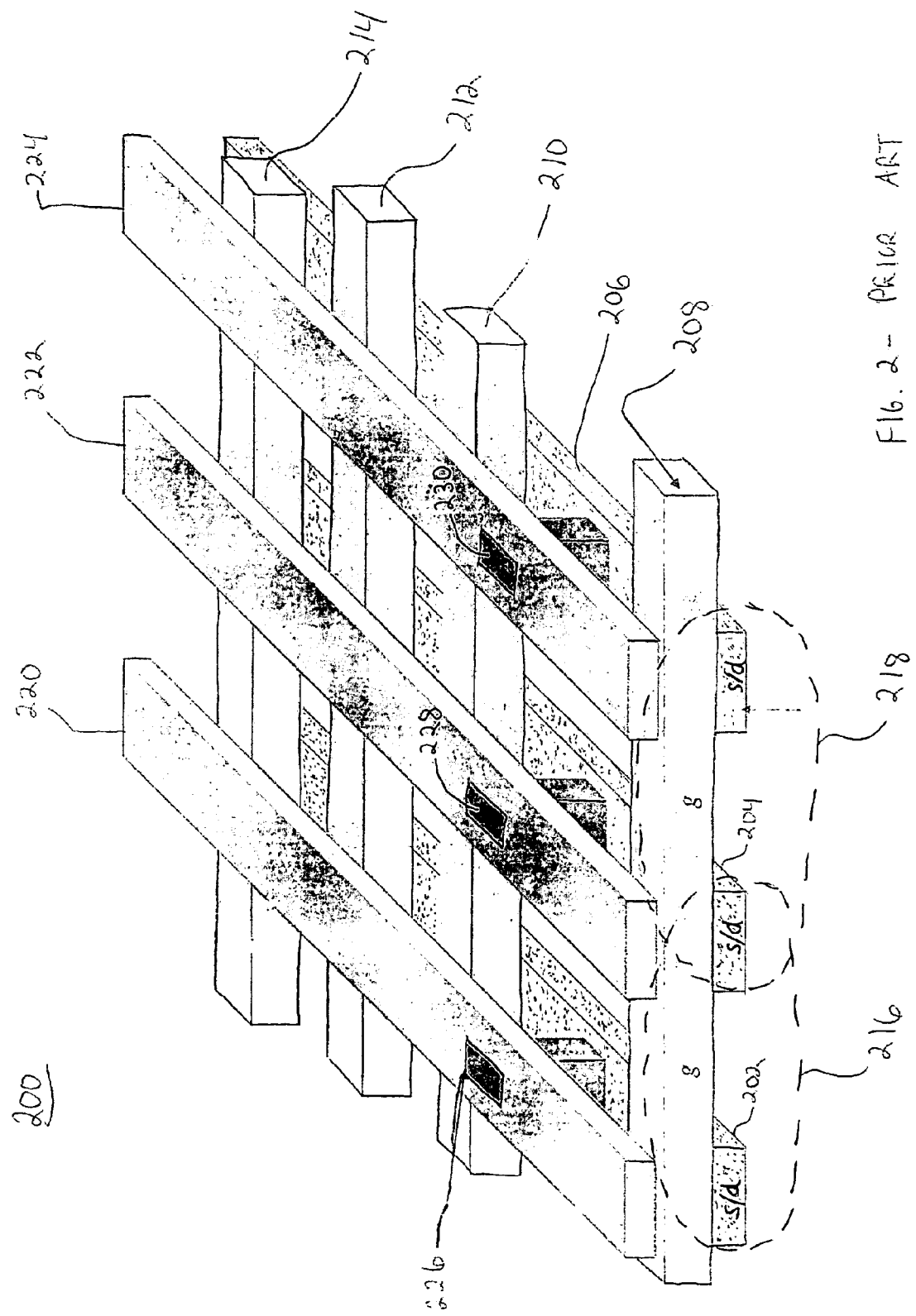
FIG. 2 is a simplified diagram of a plurality of dual bit memory cells arranged in accordance with a conventional virtual ground array architecture.
Figure 5:
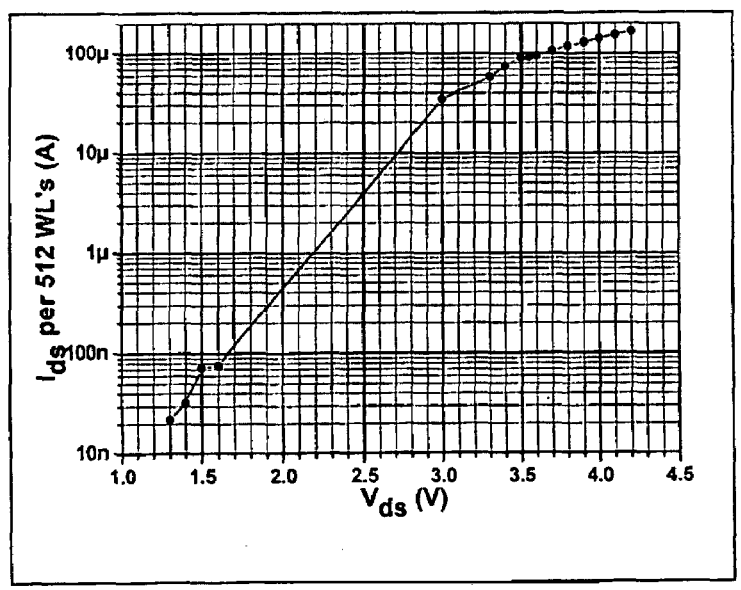
FIG. 5 is a graph of leakage current versus drain voltage for a grounded source.

In the context of a dual bit memory cell, FIG. 4 depicts a programming operation for the right bit: a programming voltage is applied to the wordline corresponding to target cell 406, namely, wordline 402; and a drain bias voltage is applied to a selectable bitline corresponding to the drain of target cell 406, namely, BL2. In accordance with conventional programming techniques, BL1 is grounded (in other words, the resistance element 408 shown in FIG. 2 is not present). For such conventional programming, the programming voltage is typically around 9.5 volts, the drain bias voltage is typically around 4.0 volts, and the source bias voltage is grounded at zero volts. These conventional programming conditions can potentially result in excessive bitline current leakage under unselected wordlines 404, between the wordlines in the array, and/or in the bitline contact areas of the array. FIG. 5 illustrates this bitline current leakage effect. FIG. 5 is a graph of leakage current versus drain voltage with a grounded source for an example virtual ground memory cell array with 512 wordlines, where the horizontal axis indicates the drain bias voltage and the vertical axis indicates the bitline leakage current. As shown in FIG. 5, as the drain bias voltage increases, the bitline leakage current increases, and the leakage current exceeds 10 microamperes for most practical drain bias voltages (approximately above 2.7 volts in this example). Referring again to FIG. 4, the intended programming current is labeled $I_{PR}$, and the undesirable bitline leakage current is labeled $I_{LEAK}$. The leakage current conducts through the array and results in wasted power consumption during the programming operation. This parasitic leakage current typically increases during the life span of a flash memory device, resulting in even more wasted power consumption during subsequent programming operations.

A programming operation in accordance with embodiments of the invention may also be described with reference to FIG. 4. To address the problem of excessive leakage current, a positive source bias voltage is established at a selectable bitline corresponding to the source of target cell 406 (which is BL1 in this example). This positive and nonzero source bias voltage is labeled $V_S$ in FIG. 4. In example embodiments, positive source bias voltage can control bitline leakage current, and it may be suitably adjusted to achieve a desired bitline leakage tolerance for the device, in response to a write cycle status of the array, in response to the age of the device, and/or in response to other operating conditions, parameters, or specifications.

Establishing the positive source bias voltage may be performed using any suitable technique, circuit, structure, or architecture. For example, the positive source bias voltage may be actively generated using a suitably configured voltage generator (e.g., voltage generator component 314 in FIG. 3). The actively generated source bias voltage can then be applied to BL1 via its respective metal line and bitline contacts (see FIG. 2). Alternatively, the positive source bias voltage may be passively generated by the flash memory device. For example, the source bias voltage may be passively generated in response to current conducting through target cell 406, in response to current conducting through BL1, or the like. Such passive voltage generation may be accomplished using a passive resistance element 408 coupled between BL1 and ground, as depicted in FIG. 4. Current flowing to ground results in a voltage drop across resistance element 408 and, therefore, the $V_S$ potential corresponding to the BL1 node will be pulled up. The specific value of resistance element 408 is selected according to the desired source bias voltage and according to the predicted amount of current that will flow through resistance element 408 during such programming. Notably, resistance element 408 is illustrated in dashed lines to indicate that its inclusion in the flash memory device is optional.

The following voltage ranges are typical for example flash memory devices (having an array of dual bit memory cells) carrying out the new programming technique described above: the programming voltage is between 8.0 volts and 11.0 volts; the drain bias voltage is between 3.5 volts and 5.0 volts; and the positive source bias voltage is between 0.3 volt and 1.0 volt. It may also be necessary to increase the drain bias voltage relative to the drain bias voltage utilized during a conventional programming operation with a grounded source. Thus, the flash memory device may be suitably configured to adjust the drain bias voltage in response to the positive source bias voltage. For example, if a conventional programming operation uses a drain bias voltage of 4.0 volts and a grounded source (e.g., BL1 is grounded), then a corresponding programming operation according to the invention may use a drain bias voltage of 4.4 volts and a source bias voltage of 0.6 volt (e.g., a 0.6 volt potential is established at BL1). In practice, the increase in the drain source bias voltage need not equal the desired source bias voltage, and the increase in the drain-to-source bias voltage may be less than the desired source bias voltage.

In practice, the bitlines of each cell are formed in a semiconductor substrate, as mentioned above in the description of dual bit memory cell 100 (see FIG. 1). In connection with programming operations, the semiconductor substrate is typically grounded. In this example, the bitlines of each cell have N-type conductivity and the semiconductor substrate has P-type conductivity. Therefore, establishing the positive source bias voltage at BL1 reduces bitline leakage current from BL1 to BL2. In other words, the positive source bias voltage results in a reverse biasing of the BL1-to-substrate junction, which cuts off the leakage current flow from BL1 to BL2.

Figure 6:
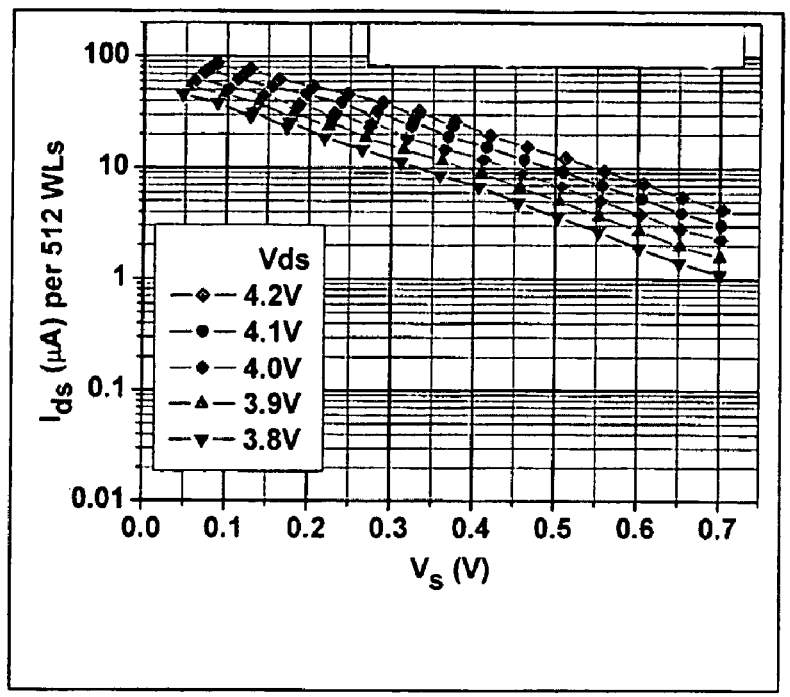
FIG. 6 is a graph of leakage current versus applied source bias voltage for different drain bias voltages.

FIG. 6 is a graph of leakage current versus applied source bias voltage for different drain bias voltages for an example virtual ground memory cell array with 512 wordlines, where the horizontal axis indicates the positive source bias voltage and the vertical axis indicates the bitline leakage current. Each plot represents a different drain bias voltage. This graph shows the typical measured dependence of the leakage current on $V_S$ at various high $V_{DS}$ potentials. Generally, for a given $V_S$, the amount of leakage current increases as $V_{DS}$ increases. Moreover, for a given $V_{DS}$, the amount of leakage current decreases as $V_S$ increases. Accordingly, the exact choice of applied $V_S$ depends upon the allowed maximum leakage current tolerance for the particular flash memory device. In FIG. 6, for example, to achieve leakage of less than 10 microamperes per bitline for all $V_{DS}$ potentials, a minimum $V_S$ of about 0.6 volt must be applied. If the particular device specifications can tolerate more leakage current, then lower $V_S$ potentials may be utilized.

The programming technique described above also facilitates the use of cells with shorter channel length without creating excessive leakage during the programming operation. Generally, as channel length decreases leakage current increases due to a reduction in channel resistance. Consequently, as flash memory devices are scaled down, leakage current becomes more noticeable. The use of a suitably scaled $V_S$ potential can reduce such leakage current such that shorter channel lengths can be realized without a significant operating power penalty.

Figure 7:
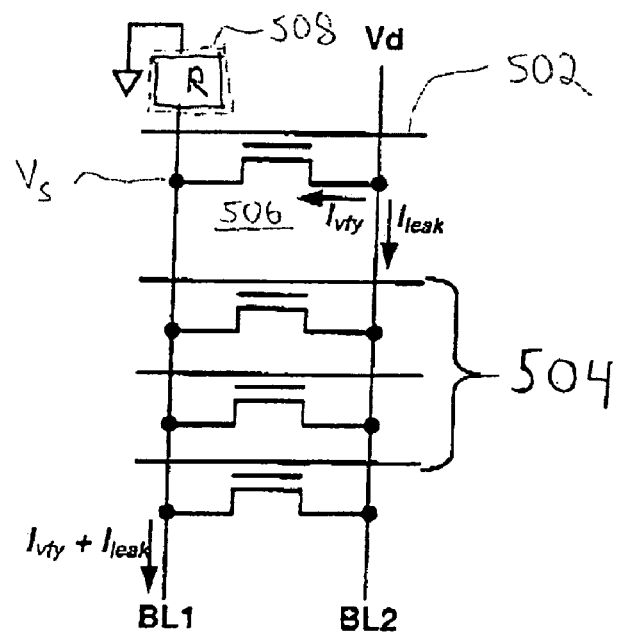
FIG. 7 is a schematic diagram that depicts a verification operation according to an example embodiment of the invention.

FIG. 7 is a schematic diagram that depicts a verification operation according to an example embodiment of the invention. FIG. 7 shows four memory cells within a memory device array arranged in a virtual ground architecture. The arrangement and operation of the memory cells in FIG. 7 are similar to that described above in connection with FIG. 4, and common features, elements, and functionality will not be redundantly described here. FIG. 7 shows a first bitline BL1, a second bitline BL2, a selected wordline 502, three unselected wordlines 504, a target cell 506 in the array, and an optional resistance element 508 coupled between BL1 and ground. Target cell 506 represents a cell that has been selected for a verify operation (e.g., program verify, soft program verify, or erase verify), while the remaining three cells represent cells that have not been selected for verification.

Figure 8:
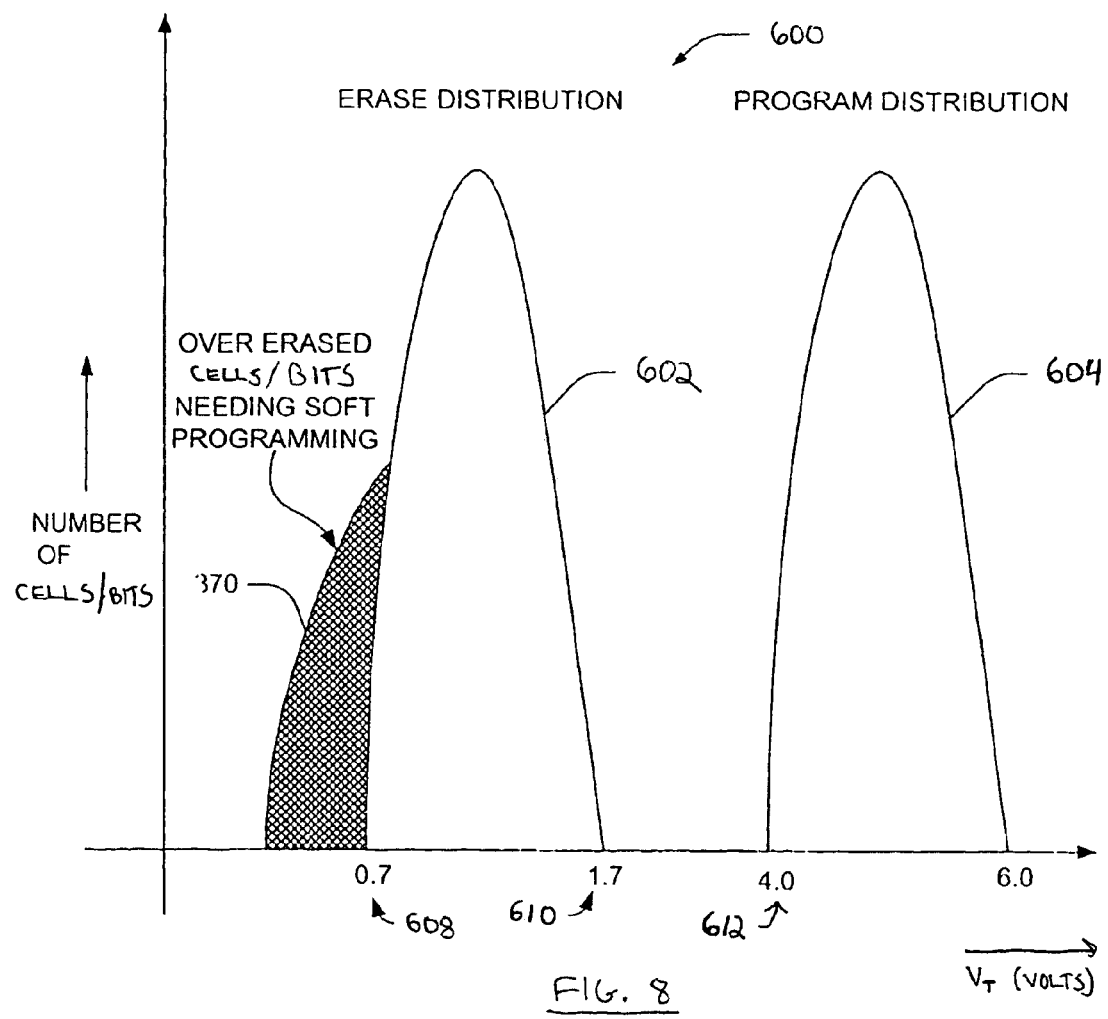
FIG. 8 is a distribution plot illustrating an erased cell threshold voltage distribution and a programmed cell threshold voltage distribution of a number of cells in an example dual bit memory cell array, together with over-erased cells that require soft programming.

Flash memory verification operations are performed to check whether the $V_T$ of a target memory cell is within a desired range corresponding to an acceptable erase state or an acceptable program state, depending upon the particular verification operation. Threshold voltage of a cell, $V_T$ is defined as the gate voltage at which a cell conducts a reference current (typically, the reference current level is around 10 microamperes) at a fixed drain-to-source voltage (typically, around 1.2 volts). In this regard, FIG. 8 is a distribution plot 600 illustrating an erased cell threshold voltage distribution and a programmed cell threshold voltage distribution of a number of cells in an example dual bit memory cell array, together with over-erased cells that require soft programming. In particular, FIG. 8 illustrates characteristic cell threshold voltage distribution curves of an exemplary dual bit memory array illustrating a desired erased cell threshold voltage distribution 602, and desired programmed cell threshold voltage distribution 604.

After an erase operation, some cells may have been over-erased, producing excessively low $V_T$ values for the over-erased cells (shaded region 606), which may cause problems with subsequent read, program verify, or erase operations. Soft programming techniques are typically used to correct the over-erased cells, by applying one or more soft program pulses to the over-erased cells. Soft programming raises the low $V_T$ of these cells above the soft program verify $V_T$ reference level (identified by reference number 608) to effectively narrow the $V_T$ distribution of erased cells in the array. Soft program verification is performed by comparing the current produced in a target memory cell to that of a reference memory cell conducting reference current (typically, the reference current level is around 10 microamperes). In this example, the soft program verify $V_T$ reference level is 0.7 volt (identified by reference number 608).

After an erase operation, some cells may remain under-erased, producing excessively high $V_T$ values for the under-erased cells. In this example, if the $V_T$ of a cell exceeds 1.7 volts (identified by reference number 610), then that cell is deemed to be under-erased, un-erased, or programmed. Erase verification is performed by comparing the current produced in a target memory cell to that of a reference memory cell conducting reference current. In this example, the erase verify $V_T$ reference level is 1.7 volts. If a cell is deemed to be under-erased, then one or more additional erase pulses will be applied to that cell in an attempt to lower its $V_T$ below the erase verify $V_T$ reference level.

After a program operation, some cells may remain under-programmed, producing excessively low $V_T$ values for the under-programmed cells. Conventional programming techniques correct under-programmed cells by applying one or more additional program pulses to the under-programmed cells. Such additional programming raises (or corrects) the low $V_T$ on these cells. Program verification is performed by comparing the current produced in a target memory cell to that of a reference memory cell conducting reference current. In this example, the program verify $V_T$ reference level is 4.0 volts (identified by reference number 612).

FIG. 7 depicts a general verifying operation for the left bit: a verification voltage is applied to the wordline corresponding to target cell 506, namely, wordline 502; and a drain bias voltage is applied to a selectable bitline corresponding to the drain of target cell 506, namely, BL2. In accordance with conventional verification techniques, BL1 is grounded (in other words, the resistance element 508 shown in FIG. 2 is not present). For such conventional verifications, the drain bias voltage is typically around 1.2 volts, and the source bias voltage is grounded at zero volts. These conventional verification conditions can potentially result in excessive bitline current leakage under unselected wordlines 504, between the wordlines in the array, and/or in the bitline contact areas of the array (as described above in the context of conventional programming operations). In FIG. 7, the intended verification current is labeled $I_{VFY}$, and the undesirable bitline leakage current is labeled $I_{LEAK}$. The leakage current flows through BL2 and may cause errors when the verification procedure compares the measured current in BL2 to the reference current. This problem is particularly noticeable during verification operations, which typically call for accurate conduction of a very low current (for example, only 10 microamperes) through the target cell. With such low verification current, even slight leakage current (for example, 4 microamperes) can introduce significant errors in the verification procedure.

Verification operations in accordance with embodiments of the invention may also be described with reference to FIG. 7. The following description applies to program verify operations, erase verify operations, and soft program verify operations. To address the problem of excessive leakage current, a positive source bias voltage is established at a selectable bitline corresponding to the source of target cell 506 (which is BL1 in this example). This positive and nonzero source bias voltage is labeled $V_S$ in FIG. 7. In example embodiments, positive source bias voltage can control bitline leakage current, and it may be suitably adjusted to achieve a desired bitline leakage tolerance for the device, in response to a write cycle status of the array, in response to the age of the device, and/or in response to other operating conditions, parameters, or specifications.

Establishing the positive source bias voltage may be performed using any suitable technique, circuit, structure, or architecture. In particular, the positive source bias voltage may be actively or passively generated using, for example, the techniques described above in the context of the new programming operation depicted in FIG. 4.

Depending upon the particular verification operation, the verification voltage may represent a program verify voltage, an erase verify voltage, or a soft program verify voltage. The specific voltage level may vary according to the desired or expected verification current. The following voltage ranges are typical for example flash memory devices (having an array of dual bit memory cells) carrying out the verification technique described herein: the drain bias voltage is between 1.0 volt and 1.5 volts; and the positive source bias voltage is between 0.2 volt and 0.4 volt. As mentioned above for the programming operation scenario, it may also be necessary to increase the drain bias voltage relative to the drain bias voltage utilized during a conventional verification operation. As also mentioned above for the programming operation scenario, the semiconductor substrate is typically grounded during verification operations, and establishing the positive source bias voltage at BL1 reduces bitline leakage current from BL1 to BL2.

In practice, the positive source bias voltage can significantly reduce or eliminate the $I_{LEAK}$ component such that the $I_{VFY}$ current can be accurately processed. In other words, a verification operation according to an example embodiment of the invention does not include the source of error inherent in conventional verification operations. In example embodiments, the application of a positive $V_S$ bias potential can control the leakage current to within a tolerable range, for example, one microampere. The flash memory system obtains a measured current conducting through the target cell (again, this measured current includes little, if any, bitline leakage current), generates a corresponding reference current with a reference cell, and compares the measured current to the reference current to obtain a comparison indicator. Ideally, the measured current will very closely approximate the actual verification current. The flash memory system can then determine, based upon the comparison indicator, whether the given $V_T$ for the target cell is appropriate.

Referring to FIG. 8, during a program verify operation the flash memory system may determine whether the comparison indicator corresponds to a $V_T$ that is above or below the program verify reference level 612. Similarly, during an erase verify operation the flash memory system may determine whether the comparison indicator corresponds to a $V_T$ that is above or below the erase verify reference level 610. Likewise, during a soft program verify operation the flash memory system may determine whether the comparison indicator corresponds to a $V_T$ that is above or below the soft program verify reference level 608. The comparison of the measured current to the reference current, and the processing of the results of the comparison, may be performed in accordance with known methodologies. Such known aspects of flash memory verification operations will not be described in detail here.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention, where the scope of the invention is defined by the claims, which includes known equivalents and foreseeable equivalents at the time of filing this patent application.

What is claimed is:

1. A method of programming a nonvolatile memory device having an array of cells arranged in a virtual ground architecture, each cell including a gate corresponding to a wordline in the array, a selectable source/drain corresponding to a bitline in the array, and a selectable drain/source corresponding to a bitline in the array, the method comprising:
   selecting a target cell in the array for programming;
   applying a programming voltage to the wordline corresponding to the target cell;
   applying a drain bias voltage to a first selectable bitline corresponding to the drain of the target cell; and
   establishing a positive source bias voltage at a second selectable bitline corresponding to the source of the target cell, the positive source bias voltage being adjusted in response to a write cycle status of the array.

2. A method according to claim 1, wherein establishing the positive source bias voltage comprises applying the positive source bias voltage to the second selectable bitline.

3. A method according to claim 1, wherein establishing the positive source bias voltage comprises passively generating the positive source bias voltage in response to current conducting through the second selectable bitline.

4. A method according to claim 3, wherein passively generating the positive source bias voltage comprises conducting the current through a passive resistance coupled between the second selectable bitline and ground.

5. A method according to claim 1, wherein:
   the programming voltage is between 8 volts and 11 volts;
   the drain bias voltage is between 3.5 volts and 5.0 volts; and
   the positive source bias voltage is between 0.3 volt and 1.0 volt.

6. A method according to claim 1, further comprising defining the drain bias voltage and the positive source bias voltage according to a program threshold voltage of the target cell.

7. A method according to claim 1, wherein:
   the bitlines of each cell are formed in a semiconductor substrate; and
   the method further comprises grounding the semiconductor substrate.

8. A method according to claim 7, wherein:
   the bitlines of each cell have N-type conductivity;
   the semiconductor substrate has P-type conductivity; and
   establishing the positive source bias voltage at the second selectable bitline reduces bitline leakage current from the second selectable bitline to the first selectable bitline.

9. A method of programming a nonvolatile memory device having an array of cells arranged in a virtual ground architecture, each cell including a gate corresponding to a wordline in the array, a selectable source/drain corresponding to a bitline in the array, and a selectable drain/source corresponding to a bitline in the array, the method comprising:
   selecting a target cell in the array for programming;
   applying a programming voltage to the wordline corresponding to the target cell;
   applying a drain bias voltage to a first selectable bitline corresponding to the drain of the target cell;
   adjusting a positive source bias voltage in response to a write cycle status of the array; and
   controlling bitline leakage current with the positive source bias voltage at a second selectable bitline corresponding to the source of the target cell.

10. A method according to claim 9, further comprising defining the positive source bias voltage in response to a bitline leakage tolerance.

11. A method according to claim 9, further comprising adjusting the drain bias voltage in response to the positive source bias voltage.

12. A method of programming a nonvolatile memory device having an array of cells arranged in a virtual ground architecture, each cell including a gate corresponding to a wordline in the array, a selectable source/drain corresponding to a bitline in the array, and a selectable drain/source corresponding to a bitline in the array, the method comprising:
   selecting a target cell in the array for programming;
   applying a programming voltage to the wordline corresponding to the target cell;
   applying a drain bias voltage to a first selectable bitline corresponding to the drain of the target cell; and
   establishing a positive source bias voltage at a second selectable bitline corresponding to the source of the target cell, the positive source bias voltage being adjusted in response to the age of the nonvolatile memory device.

* * * * *